United States Patent [19]
Nakamura

[11] Patent Number: 4,571,794
[45] Date of Patent: Feb. 25, 1986

[54] METHOD OF ACCOMMODATING ELECTRONIC COMPONENT IN CASING

[75] Inventor: Takeshi Nakamura, Uji, Japan

[73] Assignee: Murata Manufacturing Co., Ltd., Kyoto, Japan

[21] Appl. No.: 515,262

[22] Filed: Jul. 19, 1983

[30] Foreign Application Priority Data

Jul. 22, 1982 [JP] Japan .................................. 57-128466

[51] Int. Cl.⁴ ............................................ H04R 17/00
[52] U.S. Cl. .................................. 29/25.35; 156/273.9
[58] Field of Search .................... 29/25.35; 156/273.9, 156/379.7; 310/367, 348, 344, 370

[56] References Cited

U.S. PATENT DOCUMENTS 2,388,242 11/1945 Arndt, Jr. .................... 156/273.9 X
3,089,922 5/1963 Kelly et al. ...................... 310/345 X

FOREIGN PATENT DOCUMENTS 117315 8/1982 Japan .

Primary Examiner—Howard N. Goldberg
Assistant Examiner—Timothy V. Eley
Attorney, Agent, or Firm—Wenderoth, Lind & Ponack

[57] ABSTRACT

A method of accommodating an electronic component in a casing, comprising the steps of: forming the casing by a pair of first and second casings made of thermoplastic resin; providing a terminal frame having a substrate portion, a plurality of lead terminals and at least two electrically conductive terminals; securing the electronic component to the substrate portion or integrally forming the electronic component with the substrate portion; interposing the substrate portion between the first and second casings; and establishing electrical conduction between the electrically conductive terminals so as to heat the substrate portion such that the first and second casings are attached to each other through melting thereof.

9 Claims, 6 Drawing Figures

METHOD OF ACCOMMODATING ELECTRONIC COMPONENT IN CASING

BACKGROUND OF THE INVENTION

1. Field of the Invention

The present invention generally relates to electronic components and more particularly, to a method of accommodating an electronic component in an outer casing, by which an element itself of the electronic component such as a piezoelectric resonator or the like subjected to mechanical vibration is sheathed or encapsulated in the hollow outer casing.

2. Description of the Prior Art

Conventionally, in methods of this kind, it has been so arranged that electronic components such as integrated circuits, etc. are sheathed, i.e., encapsulated, by transfer molding in which epoxy resin is charged into a mold. However, it has been difficult to sheathe or encapsulate, by the transfer molding, elements themselves of electronic components such as piezoelectric resonators, acoustic vibrators, etc. with sheathing casings in which space for allowing them to mechanically vibrate is required to be formed.

Thus, in order to sheathe or encapsulate the elements themselves of the electronic components of this kind, it has been conventionally so arranged that a pair of sheathing casings made of ceramic and having a hollow structure are bonded to each other by the use of low-melting glass, adhesive, etc. However, this prior art sheathing method has such inconveniences that it becomes difficult not only to apply low-melting glass, adhesive, etc. to mating surfaces of the sheathing casings, but to position the sheathing casings accurately when the sheathing casings become compact for sheathing electronic components small in size. Furthermore, the prior art sheathing method has such disadvantages as requirements for long curing time, high curing temperature, low production efficiency, etc.

Consequently, in order to eliminate the above described inconveniences of the prior art sheathing methods, an improved sheathing method was proposed in Japanese Patent Application No. 117315/1982 (Tokugansho 57-117315) filed on July 5, 1982, of which the present inventor is one of the co-inventors and which is assigned to the same assignee as the present case. In the proposed method, a terminal frame formed by a metallic plate having a shape of a frame for securing an electronic component thereto is interposed between a pair of sheathing casings made of thermoplastic resin. Each is formed with a recessed portion. The terminal frame is electrically heated, so that mating faces of the sheathing cases are attached to each other through melting thereof. More specifically, referring to FIGS. 1 to 3, in the proposed method, an acoustic vibrator 11 supported by a terminal frame 12 is accommodated in a pair of a first sheathing casing 13 and a second sheathing casing 14 attached to each other.

The acoustic vibrator 11 includes a square frame member 15 formed by blanking a metallic plate made of metals having a constant modulus of elasticity, such as elinvar, etc., a rectangular acoustic vibrator body 17 provided inside the frame member 15, and coupling pieces 16a, 16b, 16c and 16d for supporting, at node portions of vibration of the acoustic vibrator body 17, the acoustic vibrator body 17. The coupling pieces 16a and 16d and the coupling pieces 16b and 16c are, respectively, provided at opposite sides of the acoustic vibrator body 17 symmetrically. A piezoelectric film 18 made of piezoelectric materials such as zinc oxide, etc. is formed on upper faces of the acoustic vibrator body 17. The coupling piece 16a and one portion of the frame member 15 adjacent to the coupling piece 16a are shown in FIG. 1. It should be noted here that the hatching in FIG. 1 does not illustrate a cross-section of the acoustic vibrator 11, but is given only for depicting the piezoelectric film 18 for convenience. Furthermore, a drive electrode film 19a, a lead electrode film 19b and an outlet electrode film 19c are formed on the piezoelectric film 18. It is to be further noted that the piezoelectric film 18 disposed under the lead electrode film 19b and the outlet electrode film 19c functions as an insulating layer.

Meanwhile, the terminal frame 12 has a frame portion of substantially square annular shape and includes a pair of U-shaped projections 21a and 21d projecting outwardly from opposite ends of one side of the frame portion in parallel with each other, a pair of U-shaped projections 21b and 21c projecting outwardly from opposite ends of the other side of the frame portion in alignment with the projections 21a and 21d, respectively, supporting pieces 20a, 20b, 20c and 20d protruding inwardly from the terminal frame 12 and disposed adjacent to the projections 21a, 21b, 21c and 21d, respectively, and lead terminals 22a, 22b, 22c and 22d projecting outwardly from the projections 21a, 21b, 21c and 21d in the same directions as the projections 21a, 21b, 21c and 21d, respectively. The supporting pieces 20a and 20b are provided diagonally symmetrically with respect to the supporting pieces 20c and 20d, respectively. As shown in FIG. 2, the projections 21a, 21b, 21c and 21d have a pair of leg portions 21a1 and 21a2, a pair of leg portions 21b1 and 21b2, a pair of leg portions 21c1 and 21c2 and a pair of leg portions 21d1 and 21d2, respectively.

The first sheathing casing 13 of FIG. 1 and the second sheathing casing 14 of FIG. 1 each are formed into a square plate by molding thermoplastic resin such as polycarbonate, polyacetal, polyethylene, etc. and have mating faces 13b and 14b formed at peripheral side edges thereof, respectively and square recessed portions 13a and 14a enclosed by the mating faces 13b and 14b, respectively, such that the acoustic vibrator 11 is accommodated in the recessed portions 13a and 14a, with the mating faces 13b and 14b confronting each other. It is to be noted here that the frame portion of the terminal frame 12 is arranged to correspond, in configuration, to the mating faces 13b and 14b.

As shown in FIG. 2, the terminal frame 12 having the acoustic vibrator 11 secured to the supporting pieces 20a to 20d by welding (not shown) or by the use of electrically conductive adhesive (not shown) is interposed between the first sheathing casing 13 and the second sheathing casing 14 such that the supporting piece 20a is connected to the outlet electrode film 19b by the use of solder, bonding agent or electrically conductive adhesive or through mere contact therebetween, with the terminal frame 12 being in contact with the mating faces 13b and 14b. Then, the terminal frame 12 is electrically conducted or subjected to induction heating so as to be heated. When the terminal frame 12 is heated, the mating faces 13b and 14b in contact with the terminal frame 12 melt. Thereafter, when heating of the terminal frame 12 is stopped so as to lower the temperature of the terminal frame 12, the first sheathing casing 13 and the second sheathing casing 14 are attached to each other by thermoplastic resin forming the first sheathing casing 13 and the second, sheathing casing 14, whereby the acoustic vibrator 11 of FIG. 1 is accommodated in the recessed portions 13a and 14a.

Subsequently, when, for example, the leg portion 21a2 disposed inwardly of the leg portion 21a2 of the projection 21a and the leg portion 21b2 disposed inwardly of the leg portion 21b1 of the projection 21b are cut off as shown in dotted lines in FIG. 2, the lead terminals 22a and 22b are electrically conducted to the drive electrode film 19a, and the lead terminals 22c and 22d are electrically conducted to the acoustic vibrator body 17.

When the projections 21a to 21d of the terminal frame 12 are bent at right angles to the frame portion of the terminal frame 12 towards the second sheathing casing 14 and then, the lead terminals 22a to 22d are cut to a proper length, an acoustic vibrating component having a dual in-line type terminal structure can be obtained.

Furthermore, when, for example, the projections 21b and 21c projecting from one side of the first sheathing casing 13 and the second sheathing casing 14 are cut off before the projections 21a to 21d are bent at right angles to the frame portion of the terminal frame 12 towards the second sheathing casing 14 as described above, an acoustic vibrating component having a single in-line terminal structure constituted by the lead terminals 22a and 22d projecting from the other side of the first sheathing casing 13 and the second sheathing casing 14 can be obtained.

Moreover, the terminal frame 12 can be replaced by a terminal frame 12' shown in FIG. 3. The terminal frame 12' includes supporting pieces 20c' and 20d' in place of the supporting pieces 20c and 20d of the terminal frame 12, respectively. Namely, the supporting piece 20c' projects inwardly from the terminal frame 12' in parallel with the supporting piece 20b, while the projecting piece 20d' projects inwardly from the terminal frame 12' so as to confront the supporting piece 20a.

However, the above described method proposed in the Japanese Patent Application No. 117315/1982 has such inconveniences that, since the lead terminals 22a to 22d of the terminal frame 12 are used as terminals for electrical conduction for heating the terminal frame 12, electric current is caused to flow through the lead terminals 22a to 22d when the terminal frame 12 is electrically conducted so as to be heated, with the result that solder deposited on the lead terminals 22a to 22d are removed therefrom, etc.

SUMMARY OF THE INVENTION

Accordingly, an essential object of the present invention is to provide an improved method of accommodating an electronic component in a casing, in which at least two electrically conductive terminals are provided on a substrate portion of a terminal frame for securing the electronic component thereto and the substrate portion is interposed between a pair of casings made of thermoplastic resin such that a predetermined voltage is applied between the electrically conductive terminals so as to subject the substrate portion to resistance heating, whereby mating faces of the casings are attached to each other through melting thereof, with substantial elimination of the disadvantages inherent in conventional methods of this kind and the Japanese Patent Application No. 117315/1982 referred to above. Another important object of the present invention is to provide an improved method as described above which is highly reliable in actual use and can be readily applied to electronic components and the like at low cost.

In accomplishing these and other objects according to one preferred embodiment of the present invention, there is provided an improved method of accommodating an electronic component in a casing, comprising the steps of: forming said casing by a pair of first and second casings such that a mating face of said first casing and a corresponding mating face of said second casing confront each other; providing a terminal frame having a substrate portion formed into a shape of frame, a plurality of lead terminals and at least two electrically conductive terminals such that said lead terminals and said electrically conductive terminals project outwardly from said substrate portion; securing said electronic component to said substrate portion or integrally forming said electronic component with said substrate portion; interposing opposite faces of said substrate portion between said mating face of said first casing and said corresponding mating face of said second casing; and establishing electrical conduction between said electrically conductive terminals so as to heat said substrate portion such that said mating face of said first casing and said corresponding mating face of said second casing are attached to each other through melting thereof, whereby said electronic component is accommodated in said first casing and said second casing attached to each other.

In accordance with the present invention, electric current for heating the terminal frame is prevented from flowing through the electronic component and even molded casings compact in size can be easily used for accommodating the electronic components therein.

BRIEF DESCRIPTION OF THE DRAWINGS

These and other objects of the present invention will become apparent from the following description taken in conjunction with the preferred embodiment thereof with reference to the accompanying drawings, in which.

Before the description of the present invention proceeds, it is to be noted that like parts are designated by like reference numerals through several views of the accompanying drawings.

DETAILED DESCRIPTION OF THE PREFERRED EMBODIMENTS

Figure 1:
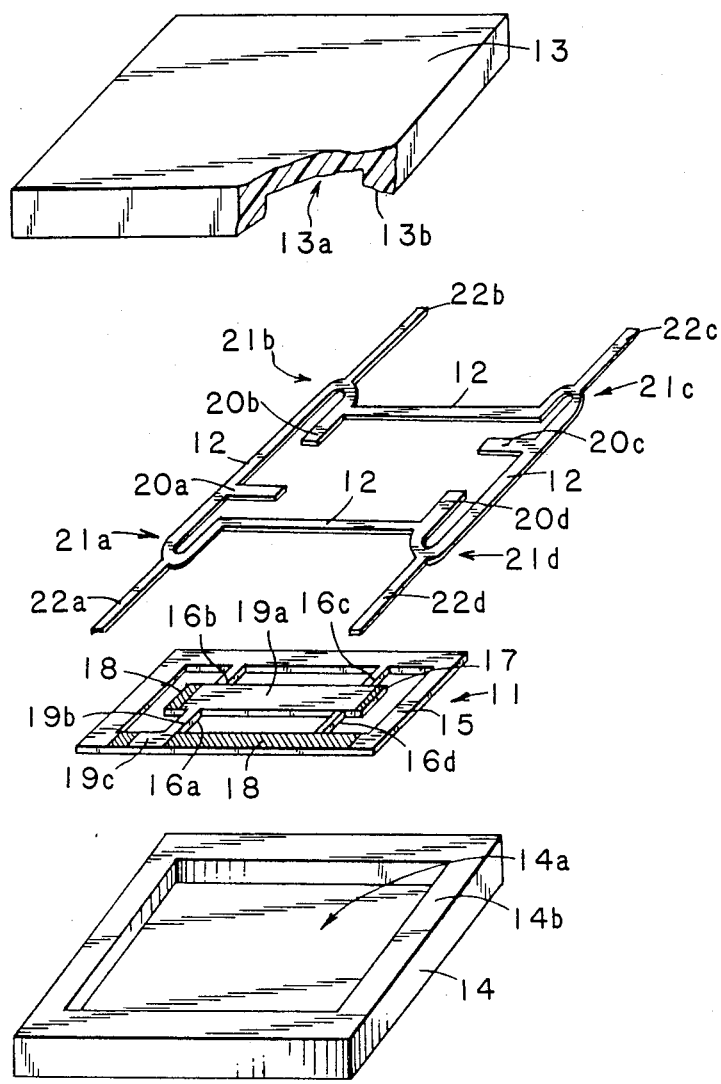
FIG. 1 is an exploded perspective view of casings for accommodating therein an electronic component attached to a terminal frame, which are employed in a method proposed in Japanese Patent Application No. 117315/1982 (already referred to)
Figure 2:
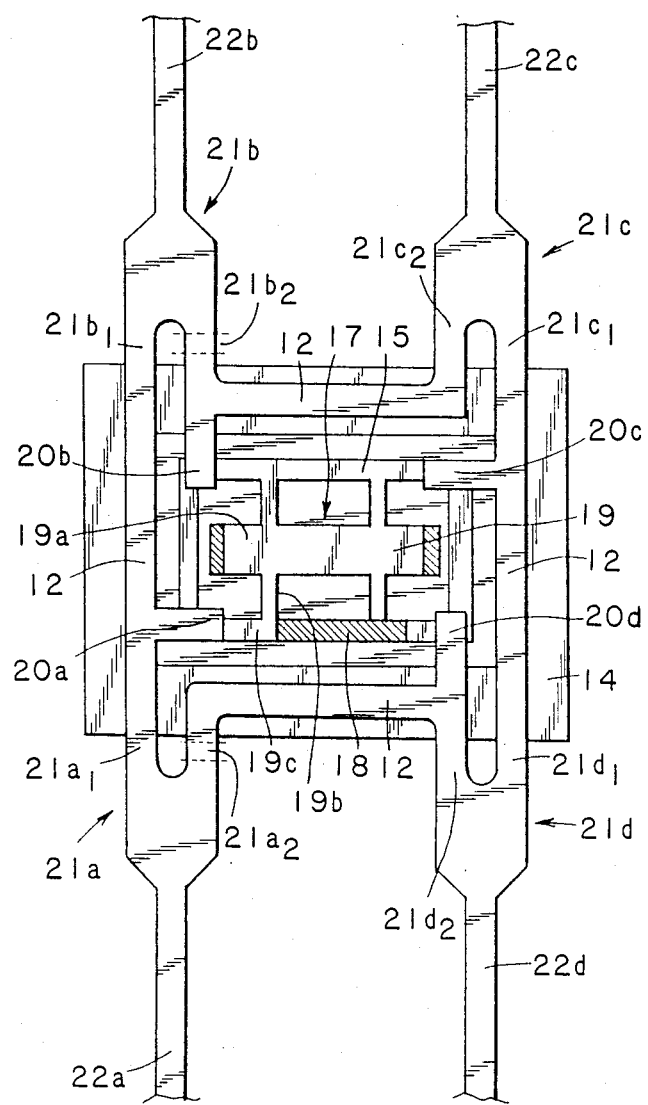
FIG. 2 is a view explanatory of assembly of the electronic component accommodated in the casings of FIG. 1 (already referred to)
Figure 3:
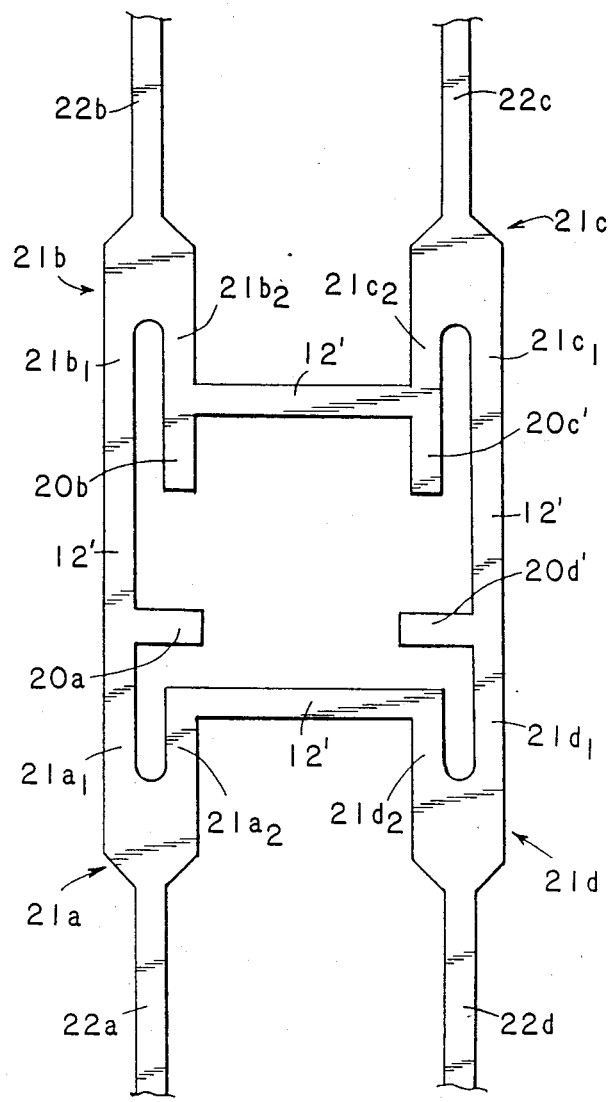
FIG. 3 is a top plan view of a terminal frame which is a modification of the terminal frame of FIG. 1 (already referred to)
Figure 4:
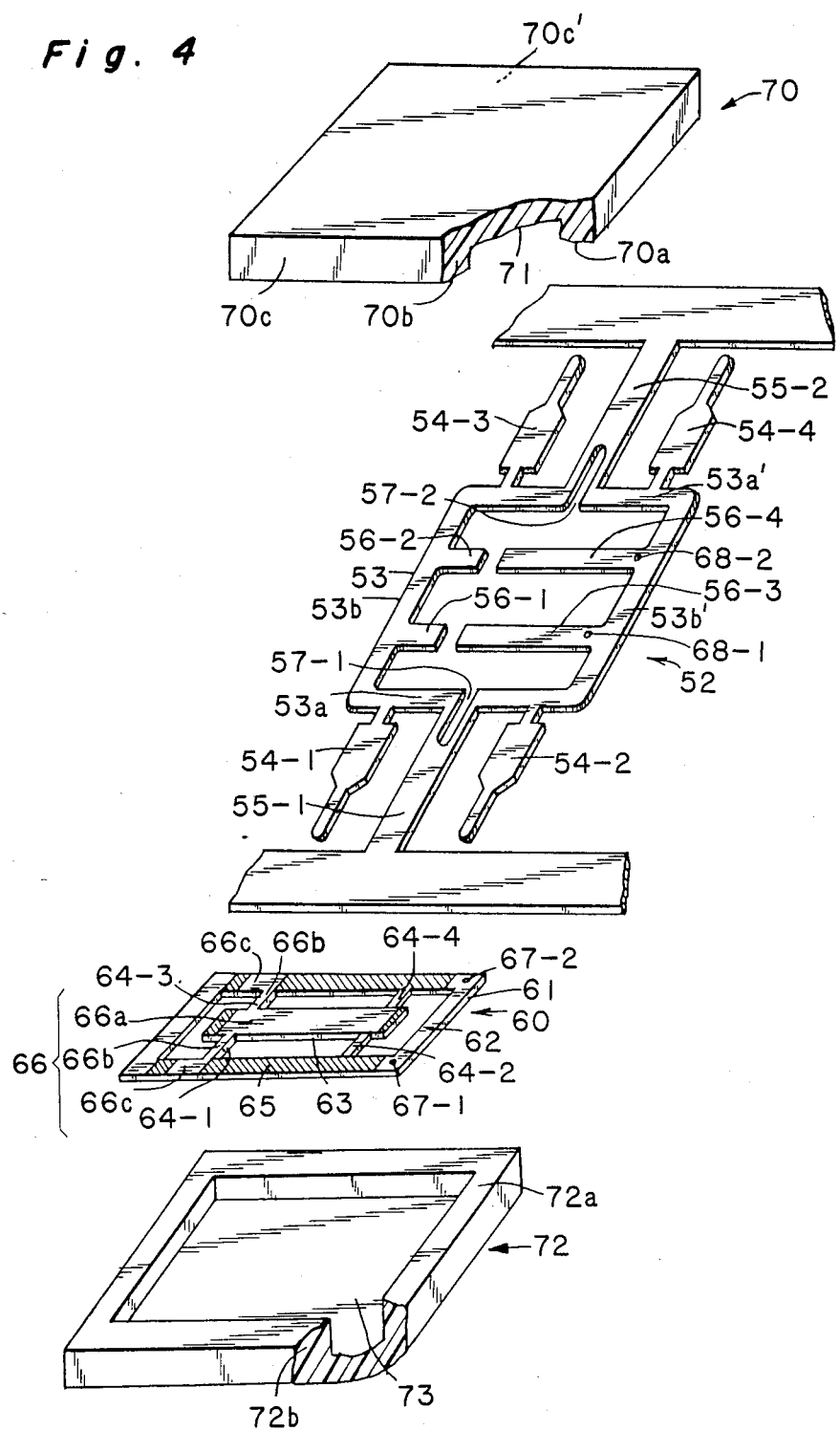
FIG. 4 is an exploded perspective view of casings for accommodating therein an electronic component attached to a terminal frame, which are employed in a method according to one preferred embodiment of the present invention.
Figure 5:
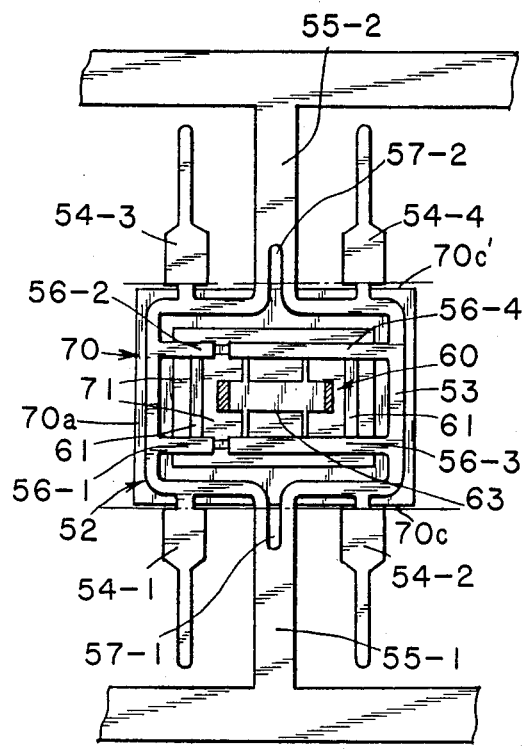
FIG. 5 is a view explanatory of assembly of the electronic component accommodated in the casings of FIG. 4.
Figure 6:
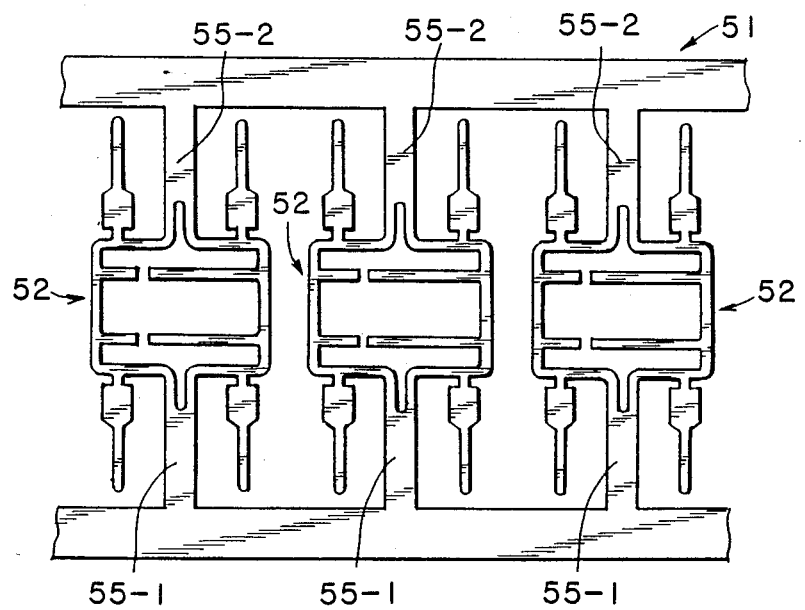
FIG. 6 is a top plan view of a terminal frame plate for connecting a plurality of the terminal frames of FIG. 4.

Referring now to FIGS. 4 to 6, in a method for accommodating an electronic component in a casing, according to one preferred embodiment of the present invention, an acoustic vibrator 60 secured to a terminal frame 52 is accommodated in a pair of a first sheathing casing 70 and a second sheathing casing 72 attached to each other.

The terminal frame 52 is formed into a one-piece construction by blanking a thin metallic plate. As shown in FIG. 6, the terminal frame 52 is formed into a terminal frame plate 51 in which a plurality of the terminal frames 52 are connected to each other in a row. As shown in FIG. 4, the terminal frame 52 includes a substrate portion 53 having a shape of a substantially square annular frame constituted by one pair of opposite sides 53a and 53a' and the other pair of opposite sides 53b and 53b', a pair of lead terminals 54-1 and 54-2 projecting outwardly and horizontally from the side 53a at right angles thereto, a pair of lead terminals 54-3 and 54-4 projecting outwardly and horizontally from the side 53a' at right angles thereto and in alignment with the lead terminals 54-1 and 54-2, respectively, a pair of eleotrically conductive terminals 55-1 and 55-2 projecting outwardly and horizontally from the sides 53a and 53a' at right angles thereto and in alignment with each other between the lead terminals 54-1 and 54-2 and between the lead terminals 54-3 and 54-4, respectively, a pair of supporting pieces 56-1 and 56-2 projecting inwardly and horizontally from the side 53b at right angles thereto and a pair of supporting pieces 56-3 and 56-4 projecting inwardly and horizontally from the side 53b' at right angles thereto and in alignment with the supporting pieces 56-1 and 56-2, respectively. The supporting pieces 56-3 and 56-4 extend longer than the supporting pieces 56-1 and 56-2. Furthermore, a pair of grooves or slots 57-1 and 57-2 of substantially U-shaped configuration are, respectively, formed at a coupling portion between the electrically conductive terminal 55-1 and the side 53a of the substrate portion 53 and at a coupling portion between the electrically conductive terminal 55-2 and the side 53a' so as to traverse the sides 53a and 53a' from inner side edges thereof into the electrically conductive terminals 55-1 and 55-2.

Meanwhile, although the electrically conductive terminals 55-1 and 55-2 function also as coupling members for connection each terminal frame 52 to the terminal frame plate 51, it can be so arranged that other coupling members are provided separately instead of the electrically conductive terminals 55-1 and 55-2.

The acoustic vibrator 60 is constituted by a plate member 61 integrally formed by blanking a metallic plate made of metals having a constant modulus of elasticity, such as elinvar, etc. The plate member 61 includes a square frame portion 62, a rectangular vibrator body 63 provided inside the frame portion 62 and coupling pieces 64-1, 64-2, 64-3 and 64-4 for supporting, at node portions of vibration the vibrator body 63. A piezoelectric film 65 made of piezoelectric materials such as zinc oxide, etc. is formed on upper faces of the vibrator body 63, the coupling pieces 64-1 and 64-3 and one portion of the frame portion 62 being shown in FIG. 4. It should be noted here that the hatching in FIG. 4 does not illustrate a cross-section of the acoustic vibrator 60, but is given only for depicting the piezoelectric film 65 for convenience. Furthermore, an electrically conductive film 66 is formed on some portions of the piezoelectric film 65 and includes a drive electrode portion 66a, a pair of lead electrode portions 66b and a pair of outlet electrode portions 66c.

The first sheathing case 70 and the second sheathing casing 72 are formed into a square shape by molding thermoplastic resin such as polycarbonate, polyacetal, PBT, PPS, etc. The first sheathing casing 70 and the second sheathing casing 72 are of an identical configuration and have peripheral side walls 70b and 72b formed at peripheral side edges thereof, respectively, recessed portions 71 and 73 enclosed by the peripheral side walls 70b and 72b, respectively and mating faces 70a and 72a formed on a lower face of the peripheral side wall 70b and an upper face of the peripheral side wall 72b, respectively, such that the mating faces 70a and 72a confront each other. Thus, when the mating face 70a of the first sheathing casing 70 and the mating face 72a of the second sheathing casing 72 are brought into contact with each other, a cavity is defined by the recessed portions 71 and 72. The peripheral side wall 70b of the first sheathing casing 70 and the peripheral side wall 72b of the second sheathing casing 72 are so shaped as to overlap the opposite sides 53a', 53b and 53b' of the terminal frame 52.

Hereinbelow, the method of the present invention for accommodating the acoustic vibrator 60 in the first sheathing casing 70 and the second sheathing casing 72 attached to each other will be described. Firstly, the acoustic vibrator 60 is secured to the substrate portion 53 of the terminal frame 52 so as to be disposed inside the substrate portion 53. At this time, as shown in FIG. 4, portions 67-1 and 67-2 of the acoustic vibrator 60 marked with small circles are, for example, spot welded to a portion 68-1 of the supporting piece 56-3 and a portion 68-2 of the supporting piece 56-4 each marked with a small circle, respectively. Meanwhile, the outlet electrode portions 66c of the acoustic vibrator 60 are, for example, soldered under pressure to the supporting pieces 56-1 and 56-2 of the terminal frame 52, respectively.

After the acoustic vibrator 60 has been secured to the terminal frame 52 as described above, the mating face 70a of the first sheathing casing 70 and the mating face 72a of the second sheathing casing 72 are, respectively, brought into contact with opposite faces of the sides 53a, 53a', 53b and 53b' of the substrate portion 53 of the terminal frame 52 such that the sides 53a, 53a', 53b and 53b' are brought into alignment with the peripheral side wall 70b of the first sheathing casing 70 and the peripheral side wall 72b of the second sheathing casing 72, so that the acoustic vibrator 60 is accommodated in the cavity defined by the recessed portion 71 of the first sheathing casing 70 and the recessed portion 73 of the second sheathing casing 72 and, at the same time, the substrate portion 53 is interposed between the mating face 70a of the first sheathing casing 70 and the mating face 72a of the second sheathing casing 72 under a predetermined pressure. Thereafter, when a predetermined voltage is applied between the electrically conductive terminals 55-1 and 55-2 of the terminal frame 52, electric current is caused to flow through the electrically conductive terminal 55-1, the substrate portion 53 and the electrically conductive terminal 55-2. Accordingly, the substrate portion 53 is heated in accordance with its resistance value, so that the mating face 70a of the first sheathing casing 70 and the mating face 72a of the second sheathing casing 72 are heated so as to be molten, whereby the mating faces 70a and 72a are attached to each other through melting thereof.

Meanwhile, since electric current does not flow through the supporting pieces 56-1 to 56-4 and the lead terminals 54-1 to 54-4, such undesirable phenomena do not take place that the acoustic vibrator 60 is damaged or solder deposited on the lead terminals 54-1 to 54-4 is removed therefrom by electric current for heating the substrate portion 53. By the above described operations, the acoustic vibrator 60 can be accommodated in the first sheathing casing 70 and the second sheathing casing 72 in a few seconds.

Subsequently, the electrically conductive terminals 55-1 and 55-2 of the terminal frame 52 sheathed by the first sheathing casing 70 and the second sheathing casing 72 are cut off along the one-dot chain lines in FIG. 5, whereby the lead terminals 54-1 and 54-3 are, respectively, electrically insulated from the lead terminals 54-2 and 54-4 by the grooves 57-1 and 57-2.

Meanwhile, the first sheathing casing 70 has opposite side faces 70c and 70c' which are, respectively, disposed adjacent to the lead terminals 54-1 and 54-2 and the lead terminals 54-3 and 54-4. The lead terminals 54-1 and 54-2 and the lead terminals 54-3 and 54-4 are, respectively, bent substantially vertically towards the side faces 70c and 70c' along the one-dot chain lines in FIG. 5, and thus, the acoustic vibrator 60 of the so-called dual in-line type molding is obtained.

It is to be noted here that, although the method according to the above described embodiment of the present invention is applied to the acoustic vibrator 60, the method of the present invention is not exclusively applied to the acoustic vibrator 60 but can be widely applied to various electronic components which make mechanical vibrations, such as a piezoelectric resonator, a reed switch, a reed relay, a bimetal, a pressure sensor, etc.

Meanwhile, as shown in FIG. 6, it can be so arranged that one electronic component is secured to or integrally formed with each of the terminal frames 52 coupled to each other in the terminal frame plate 51 and then, a plurality of the terminal frames 52 are fed to subsequent predetermined processes at a time or one by one such that the first sheathing casing 70 of FIG. 5 and the second sheathing casing 72 of FIG. 5 are attached to each of the terminal frames 52 through melting thereof, whereby the electronic component is accommodated in each pair of the first sheathing casing 70 and the second sheathing casing 72 attached to each other.

As is clear from the foregoing description, in accordance with the present invention, at least two electrically conductive terminals are provided on the substrate portion of the terminal frame having the electronic component secured thereto so as to be electrically conducted therebetween such that the mating faces of the first sheathing casing and the second sheathing casing both made of thermoplastic resin and having the substrate portion interposed therebetween are attached to each other through melting thereof, whereby electric current for heating the substrate portion is advantageously prevented from flowing through the electronic component and the electronic component can be accommodated in the first sheathing casing and the second sheathing casing remarkably efficiently and at low cost.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A method of accommodating an electronic component between a first casing and a second casing, comprising the steps of:
    placing a mating face of the first casing and a corresponding mating face of the second casing in a confronting relationship with each other;
    placing a terminal frame with a substrate portion between the mating face of the first casing and the corresponding mating face of the second casing, said terminal frame having at least one pair of lead terminals on the substrate portion and two intermediate electrically conductive terminals, each having a U-shaped slot projecting outwardly from opposite sides of the substrate portion;
    placing the electronic component in contact between the substrate portion and the mating face of one of the casings;
    passing an electric current from the one electrical conductive terminal projecting from one opposite side of the substrate portion, through the substrate portion, to the one electrical conductive terminal projecting from the other opposite side of the substrate portion so that the mating face of the first casing and the corresponding mating face of the second casing are attached together by melting to each other; and
    cutting off the electrical conductive terminals completely from the substrate portion of the U-shaped slots;
    whereby one of the at least one pair of lead terminals on the substrate portion is electrically insulated from the other of the at least one pair of lead terminals on the same side of the substrate portion and the electronic component is accommodated between the first casing and the second casing.

2. A method as claimed in claim 1, wherein said first casing and said second casing are made of thermoplastic resin taken from the group consisting of polycarbonate, PBT, and PPS.

3. A method as claimed in claim 1, wherein said electronic component is any one of an acoustic vibrator, a piezoelectric resonator, a reed switch, a reed relay, a bimetal, and a pressure sensor, which is arranged to make mechanical vibrations.

4. A method as claimed in claim 1, wherein said first casing and said second casing are, respectively, formed with a first recessed portion and a second recessed portion such that a cavity for allowing said electronic component to mechanically vibrate is defined by said first recessed portion and said second recessed portion when said first casing and said second casing have been attached to each other.

5. A method as claimed in claim 1, wherein said electronic component is an acoustic vibrator integrally formed by blanking a metallic plate of a metal having a constant modulus of elasticity.

6. A method as claimed in claim 5, wherein said acoustic vibrator is partially coated with a piezoelectric film on some portions of which an electrically conductive film is formed.

7. A method as claimed in claim 6, wherein said piezoelectric film is made of a piezoelectric material.

8. A method as claimed in claim 7, wherein said piezoelectric material is zinc oxide.

9. A method as claimed in claim 5, wherein said metal having a constant modulus of elasticity is elinvar.

* * * * *